United States Patent
Wann et al.

(10) Patent No.: US 10,304,826 B2
(45) Date of Patent: May 28, 2019

(54) COMPLIMENTARY METAL-OXIDE-SEMICONDUCTOR (CMOS) WITH LOW CONTACT RESISTIVITY AND METHOD OF FORMING SAME

(71) Applicant: Taiwan Semiconductor Manufacturing Company, Ltd., Hsin-Chu (TW)

(72) Inventors: Clement Hsingjen Wann, Carmel, NY (US); Chih-Hsin Ko, Fongshan (TW); Cheng-Hsien Wu, Hsin-Chu (TW); Ding-Kang Shih, New Taipei (TW); Hau-Yu Lin, Kaohsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 936 days.

(21) Appl. No.: 13/729,806

(22) Filed: Dec. 28, 2012

(65) Prior Publication Data
US 2014/0183645 A1   Jul. 3, 2014

(51) Int. Cl.
*H01L 27/092* (2006.01)
*H01L 21/8238* (2006.01)

(52) U.S. Cl.
CPC .... *H01L 27/092* (2013.01); *H01L 21/823814* (2013.01); *H01L 21/823871* (2013.01); *H01L 2924/0002* (2013.01)

(58) Field of Classification Search
CPC .................. H01L 21/823418; H01L 23/485
USPC .......................................................... 257/369
See application file for complete search history.

(56) References Cited

U.S. PATENT DOCUMENTS

| | | | |
|---|---|---|---|
| 6,222,240 B1* | 4/2001 | Gardner et al. | 257/410 |
| 6,506,676 B2 | 1/2003 | Park et al. | |
| 6,528,381 B2 | 3/2003 | Lee et al. | |
| 8,110,877 B2 | 2/2012 | Mukherjee et al. | |
| 2008/0237743 A1 | 10/2008 | Ramin et al. | |
| 2010/0123198 A1* | 5/2010 | Kim et al. | 257/377 |

(Continued)

FOREIGN PATENT DOCUMENTS

| | | |
|---|---|---|
| KR | 20010076840 | 8/2001 |
| KR | 20020056140 | 7/2002 |
| KR | 20130095633 | 8/2013 |

OTHER PUBLICATIONS

Vaquila et al., "Oxidation process in titanium thin films", Physical Review B, vol. 55, No. 20, May 15, 1997—II, pp. 13925-13931, The American Physical Society.*

(Continued)

*Primary Examiner* — Sitaramarao S Yechuri
(74) *Attorney, Agent, or Firm* — Slater Matsil, LLP (57) ABSTRACT

An embodiment complimentary metal-oxide-semiconductor (CMOS) device and an embodiment method of forming the same are provided. The embodiment CMOS device includes an n-type metal-oxide-semiconductor (NMOS) having a titanium-containing layer interposed between a first metal contact and an NMOS source and a second metal contact and an NMOS drain and a p-type metal-oxide-semiconductor (PMOS) having a PMOS source and a PMOS drain, the PMOS source having a first titanium-containing region facing a third metal contact, the PMOS drain including a second titanium-containing region facing a fourth metal contact.

22 Claims, 7 Drawing Sheets

(56) References Cited

U.S. PATENT DOCUMENTS

| | | | |
|---|---|---|---|
| 2010/0155846 A1* | 6/2010 | Mukherjee et al. | 257/365 |
| 2010/0224916 A1 | 9/2010 | Shimizu et al. | |
| 2010/0255652 A1* | 10/2010 | Tanioku | 438/381 |
| 2013/0106330 A1 | 5/2013 | Schramm et al. | |

OTHER PUBLICATIONS

Green, Don W. and Perry, Robert H., 1924-1978, "Perry's chemical engineers' handbook", ISBN: 0071601503 , 0071422943 (print) , 9780071422949, McGraw-Hill, 2008.*

Green et al. "Perry's Chemical Engineers' Handbook", p. 2-193, eBook, 8th ed, McGraw-Hill 2008.*

Lin, J.-Y.J., et al., "Increse in current density for metal contacts to n-germanium by inserting $TiO_2$ interfacial layer to reduce Schottky barrier height," Appl. Phys. Lett. 98, 092113 (2011); 4 pages.

Yuan, Z., et al., "Schottky barrier height reduction for metal/n-GaSb contact by inserting $TiO_2$ interfacial layer with low tunneling resistance," Appl. Phys. Letter. 98, 172106 (2011), 4 pages.

Lai, J.B. et al., "Effects of composition on the formation temperatures and electrical resistivities of C54 titanium germanosilicide in Ti—Si $1-x$ Ge $x$ systems," AIP Journal of Applied Physics, vol. 86, No. 3, 1340, Aug. 1, 1999, 7 pages.

* cited by examiner

COMPLIMENTARY METAL-OXIDE-SEMICONDUCTOR (CMOS) WITH LOW CONTACT RESISTIVITY AND METHOD OF FORMING SAME

BACKGROUND

In the manufacture of integrated circuits, devices such as transistors are formed on a wafer and connected together using multiple metallization layers. The metallization layers include vias and interconnects that function as electrical pathways to interconnect the devices. Contacts are used to connect the vias and interconnects to the source, drain, and/or gate of the devices.

In some circumstances, an interfacial layer is formed between the contacts and the source, drain, or gate of the devices. By way of example, a nickel (Ni) metal and a silicidation process may be used to form a nickel silicide (NiSi) interfacial layer.

Unfortunately, the Schottky barrier height of the NiSi interfacial layer is not uniform for both n-type and p-type devices. Indeed, the Schottky barrier height is about 0.43 electron Volts (eV) for a p-type device and about 0.67 eV for an n-type device incorporating the NiSi interfacial layer. This asymmetrical Schottky barrier height for n-type and p-type devices is not particularly suitable when the interfacial layer faces a high mobility material (e.g., germanium (Ge), gallium antimonide (GaSb), indium arsenide (InAs), etc.).

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative, and do not limit the scope of the disclosure.

The present disclosure will be described with respect to embodiments in a specific context, namely a complimentary metal-oxide-semiconductor (CMOS) device. The disclosure may also be applied, however, to other integrated circuits such as, for example, a planar metal-oxide-semiconductor field-effect transistor (MOSFET), double-gate MOSFET, tri-gate MOSFET, FinFET, and the like.

Figure 1:
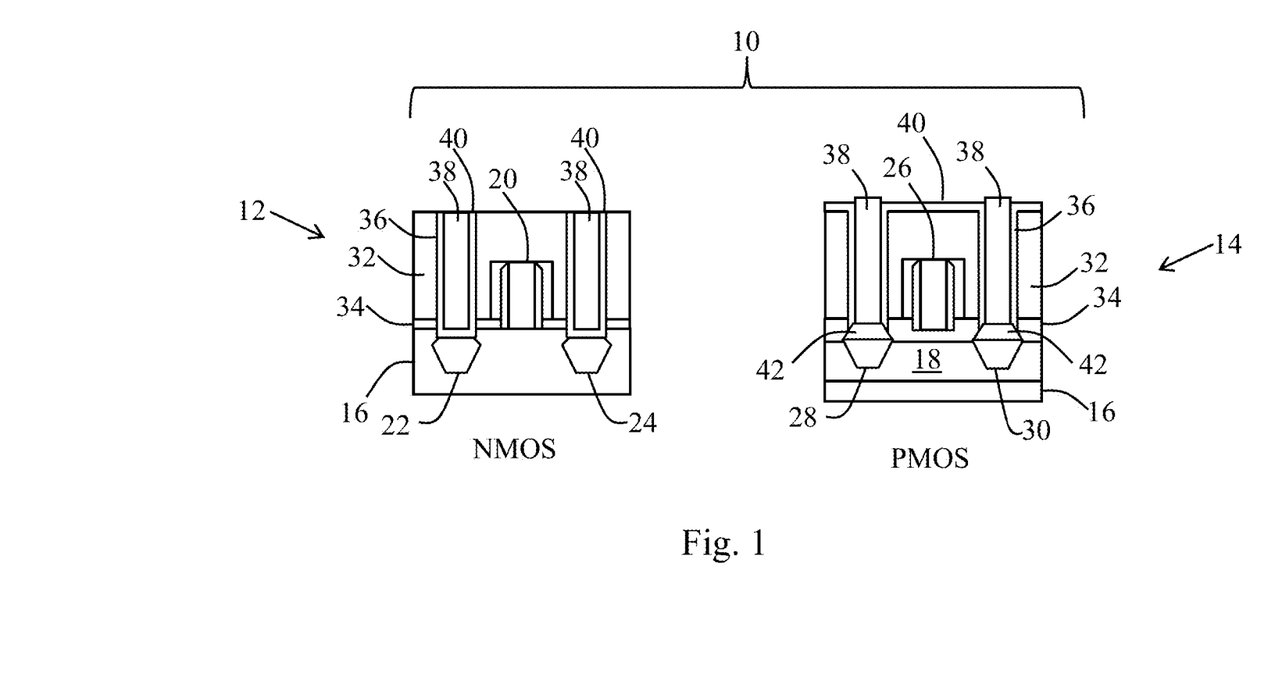
FIG. 1 illustrates an embodiment complimentary metal-oxide-semiconductor (CMOS) device.

Referring now to FIG. 1, an embodiment CMOS device 10 is illustrated. As shown, the CMOS device 10 generally includes an n-type metal-oxide-semiconductor (NMOS) device 12 and a p-type metal-oxide-semiconductor (PMOS) device 14. In an embodiment, the NMOS device 12 and the PMOS device 14 are formed over a p-type substrate 16, a portion of which has been doped to provide an n-well 18 for the PMOS device 14.

Still referring to FIG. 1, the substrate 16 supports a first gate structure 20, a first source 22, and a first drain 24 in the NMOS device 12. The substrate 16 also supports a second gate structure 26, a second source 28, and a second drain 30 in the PMOS device 14. Because the relative position of the source and drain in both the NMOS device 12 and the PMOS device 14 may be interchanged, each source and each drain may be collectively referred to as a source/drain region. In an embodiment, the first source 22, the first drain 24, the second source 28, and the second drain 30 are each epitaxially formed. In an embodiment, the first gate structure 20 and/or the second gate structure 26 may include spacers, a high-k dielectric, a metal, and so on.

In an embodiment, the first source 22 and the first drain 24 of the NMOS device 12 comprise silicon (Si), silicon phosphorus (SiP), silicon carbide phosphorus (SiCP), gallium antimony (GaSb), or silicon germanium (SiGe) having a relatively low germanium concentration. In an embodiment, the second source 28 and the second drain 30 of the PMOS device 14 comprise germanium (Ge), germanium tin (GeSn), or silicon germanium (SiGe) having a relatively high germanium concentration relative to the silicon germanium suitable for use in the first source 22 and the first drain 24.

Still referring to FIG. 1, a dielectric 32 (e.g., an interlevel dielectric) is generally formed over and supported by the substrate 16 on both the NMOS device 12 and the PMOS device 14. In an embodiment, an etch stop layer (ESL) 34 is disposed between the dielectric 32 and the substrate 16. As shown in FIG. 1, the dielectric 32 contains trenches 36 containing a contact metal 38. In an embodiment, the contact metal 38 comprises titanium (Ti), aluminum (Al), titanium nitride (TiN), tungsten (W), or another suitable contact metal.

Still referring to FIG. 1, a titanium-containing layer 40 is disposed on the sidewalls of the trenches 36 in each of the NMOS device 12 and the PMOS device 14. As such, the titanium-containing layer 40 is generally disposed between the dielectric 32 and the contact metal 38 (i.e., contacts). In an embodiment, the titanium-containing layer 40 is also formed between the contact metal 38 and the first source 22 and the contact metal 38 and the first drain 24 in the NMOS device 12. In an embodiment, the titanium-containing layer 40 is formed over a top surface of the PMOS device 14 and/or the NMOS device 12. In an embodiment, the titanium-containing layer 40 comprises a titanium dioxide (TiO$_2$). In an embodiment, the titanium-containing layer 40 has a thickness of between about 1 to about 4 nanometers (nm).

In addition to the above, the second source 28 and the second drain 30 in the PMOS device 14 include a titanium-containing region 42. As shown, the titanium-containing region 42 in the second source 28 and in the second drain 30 generally faces and/or abuts the contact metal 38. In an embodiment, the titanium-containing region 42 is a titanium silicon germanium (Ti(Si)Ge) or a titanium digermanium (TiGe$_2$), depending on the whether the underlying second source 28 and second drain 30 are formed from silicon germanium (Si) or germanium (Ge).

Because the NMOS device 12 includes the titanium-containing layer 40 and the PMOS device 14 includes the titanium-containing region 42 in the second source 28 and the second drain 30, the CMOS device 10 has a low contact resistance while being compatible with CMOS fabrication technology and processes. Indeed, by using a single metal (e.g., titanium) on both the NMOS device 12 and the PMOS device 14, the Schottky barrier height (SBH) is significantly lowered, especially for low dopant activation material.

Figure 2:
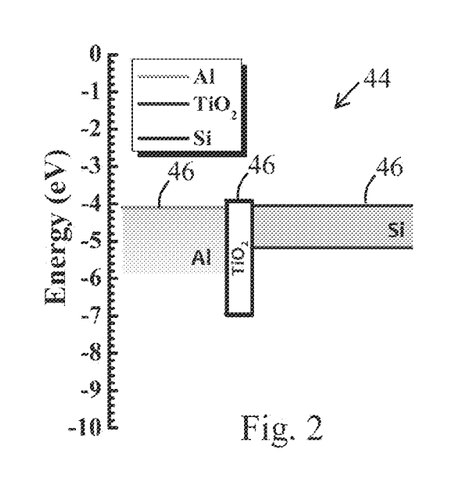
FIG. 2 is a diagram illustrating that titanium dioxide (TiO$_2$) is an effective interfacial layer for Schottky barrier height reduction for materials with an electron affinity of about four (4) electron Volts (eV)

Referring now to FIG. 2, a diagram 44 is provided to illustrate that titanium dioxide (TiO$_2$) is an effective interfacial layer for Schottky barrier height reduction for materials with an electron affinity of about four (4) electron Volts (eV). As shown in the diagram 44, the conduction band 46 of the silicon (Si) is similar to that of the titanium dioxide (TiO$_2$) and the aluminum (Al) contact. Therefore, only a small amount of energy is needed for conduction to occur when the titanium dioxide (TiO$_2$) is disposed between silicon (Si) and an aluminum (Al) contact.

Figure 3:
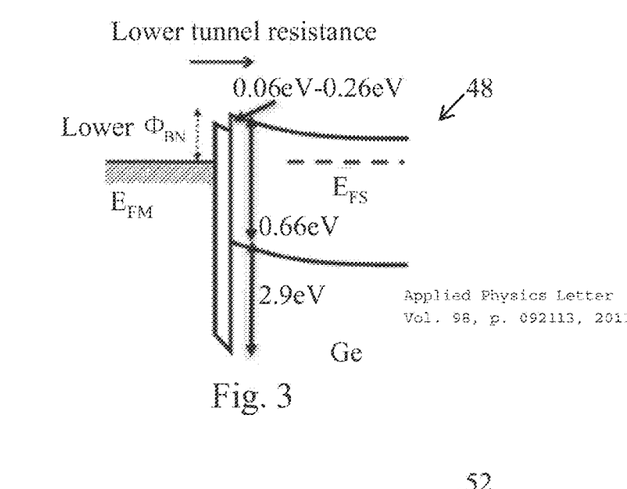
FIG. 3 is a diagram illustrating that the conduction band of germanium (Ge) is similar to that of titanium dioxide (TiO$_2$)
Figure 4:
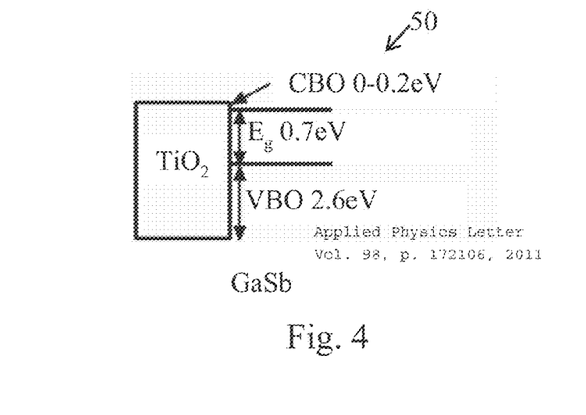
FIG. 4 is a diagram illustrating that the conduction band of gallium antimony (GaSb) is similar to that of the titanium dioxide (TiO$_2$)
Figure 5:
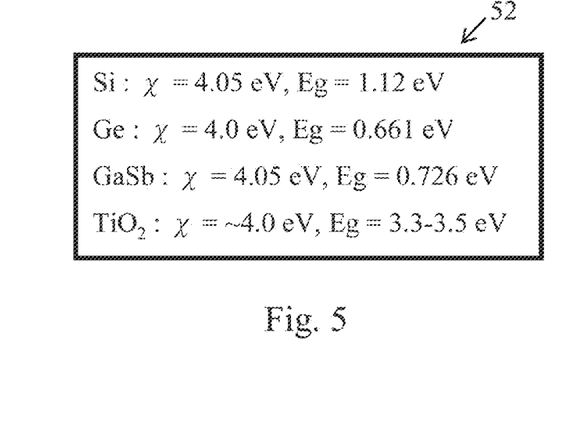
FIG. 5 is a summary of the electron affinity (x) and band gap (E$_g$) of silicon (Si), germanium (Ge), gallium antimony (GaSb), and titanium dioxide (TiO$_2$)
Figure 6:
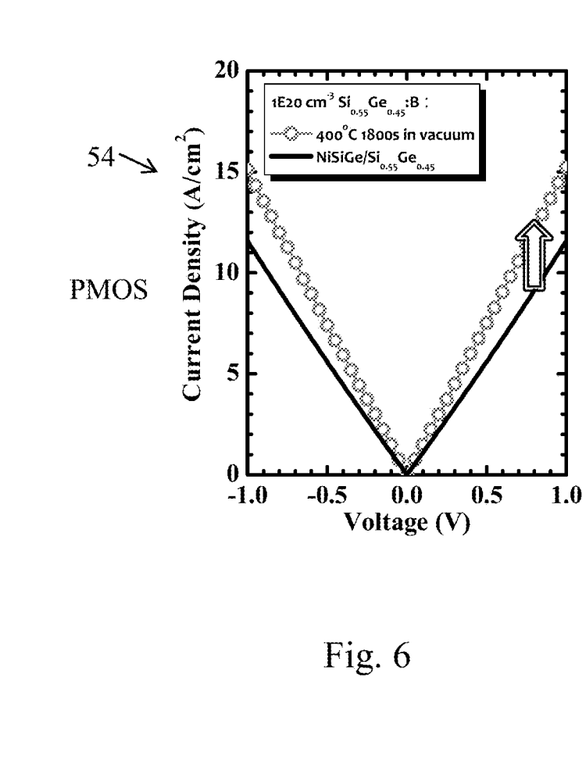
FIGS. 6-9 are graphical representations of experimental data from MOS diodes, which are similar to the NMOS device and the PMOS device of the CMOS device of FIG. 1.
Figure 7:
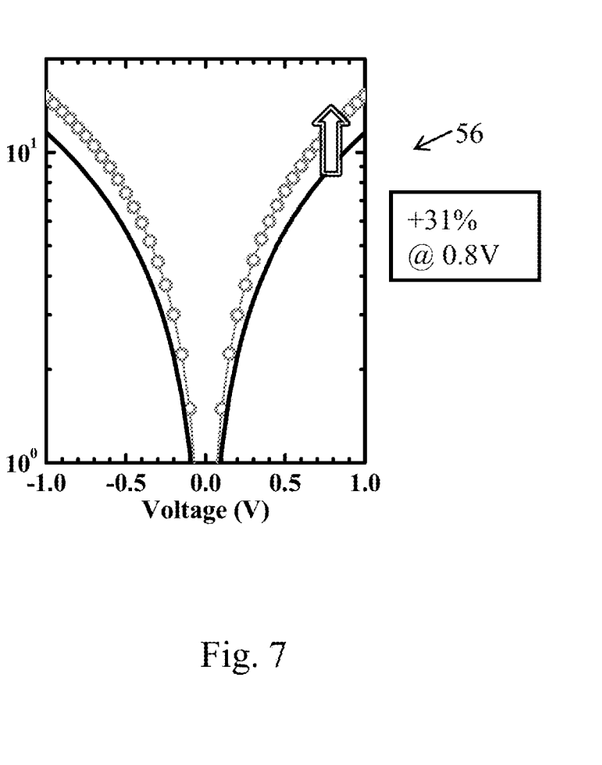
Figure 8:
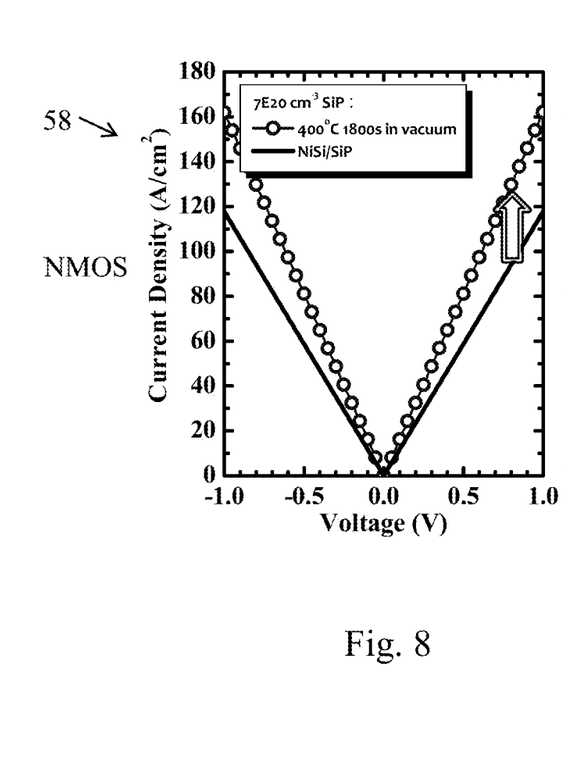
Figure 9:
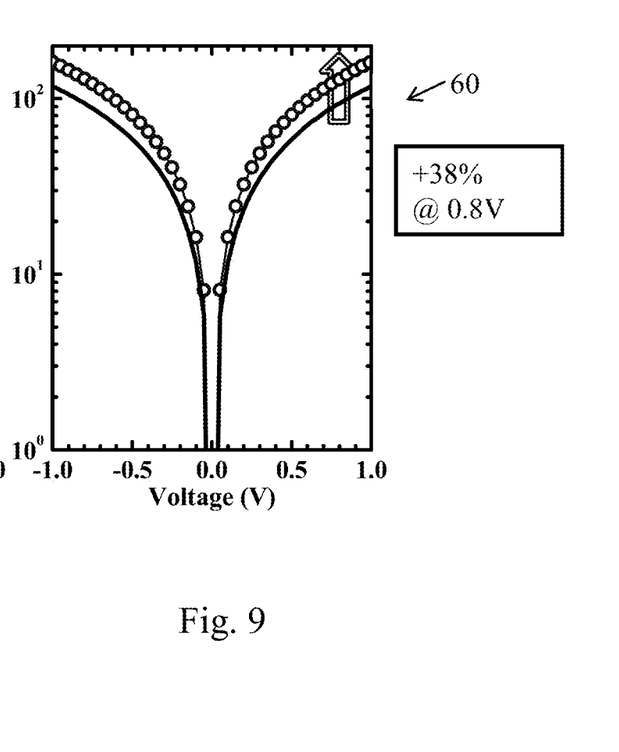

Referring now to FIGS. 3-4, diagrams 48, 50 are provided to illustrate that the conduction band of germanium (Ge) and gallium antimony (GaSb), respectively, are also similar to that of the titanium dioxide (TiO$_2$). Again, only a small amount of energy is needed for conduction to occur through a device using titanium dioxide (TiO$_2$) as an interfacial layer. As shown in FIG. 5, a summary 52 of the electron affinity (x) and band gap (E$_g$) of silicon (Si), germanium (Ge), gallium antimony (GaSb), and titanium dioxide (TiO$_2$) are provided.

Referring now to FIGS. 6-9, graphical representations 54, 56, 58, 60 of experimental data from MOS diodes, which are similar to the NMOS device 12 and the PMOS device 14, are presented. The experiment involved the deposition of about 2 nm (ex-situ) of titanium (Ti) through physical vapor deposition (PVD), the post-dielectric annealing (PDA), and contact metal of titanium nitride (TiN) or titanium (Ti). As shown, using titanium dioxide (TiO$_2$) as an interfacial layer in the NMOS device 12 and the PMOS device 14 achieves better current density per volt. Indeed, the current density per volt increased by 31% and 38% when titanium dioxide (TiO$_2$) was utilized.

Figure 10A:
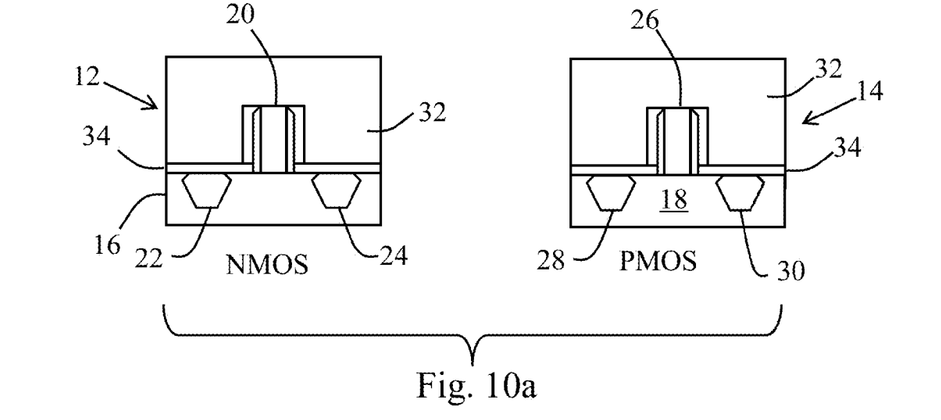
FIGS. 10a-10f collectively illustrate a process of forming the CMOS device of FIG. 1.

Referring collectively to FIGS. 10a-10f, a process of forming the CMOS device 10 of FIG. 1 is illustrated. For ease of illustration, the NMOS device 12 and the PMOS device 14 are shown separately. As shown in FIG. 10a, the first gate structure 20, the first source 22, and the first drain 24 are formed over the substrate 16 in the NMOS device 12 and the second gate structure 26, the second source 28, and the second drain 30 are formed over the n-well 18 in the PMOS device 14.

Figure 10B:
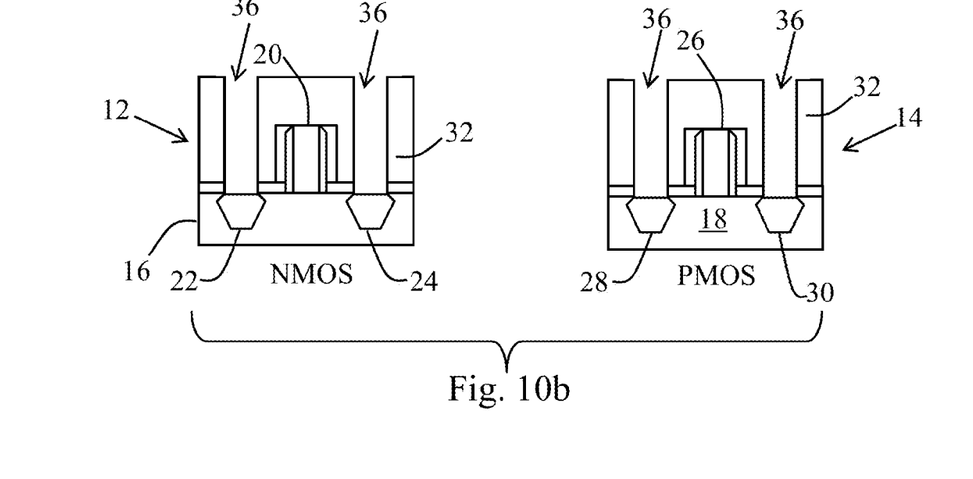

Still referring to FIG. 10a, the etch stop layer 34 and the dielectric 32 are formed over or around the first gate structure 20, the first source 22, and the first drain 24 in the NMOS device 12 and the second gate structure 26, the second source 28, and the second drain 30 in the PMOS device 14. Next, as shown in FIG. 10b, trenches 36 are etched into the dielectric 32 over the first source 22 and the first drain 24 in the NMOS device 12 and the second source 28 and the second drain 30 in the PMOS device 14.

Figure 10C:
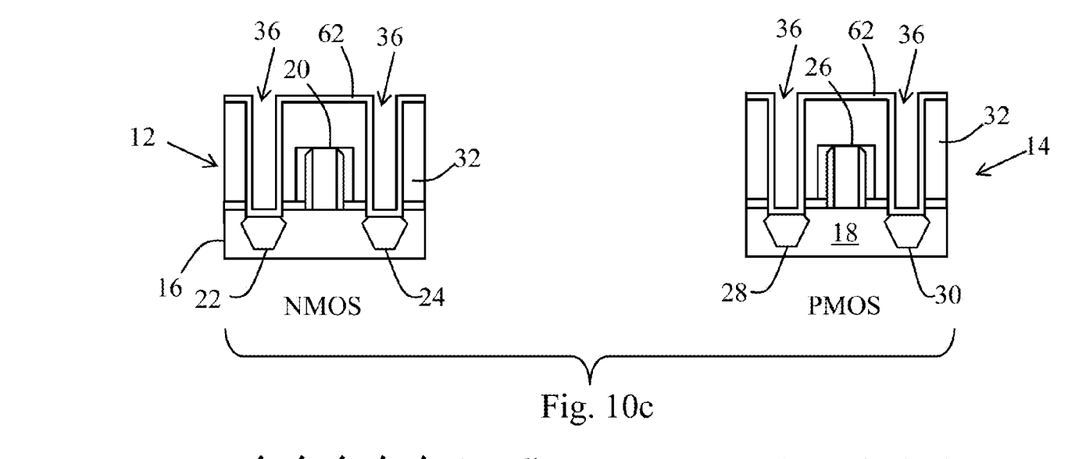

Referring now to FIG. 10c, a single metallic layer, such as a layer of titanium (Ti) 62, is deposited over the NMOS device 12 and the PMOS device 14. In an embodiment, the layer of titanium 62 is deposited through physical vapor deposition (PVD). As shown, the layer of titanium 62 generally coats the top surface of the dielectric 32 and the sidewalls of the trenches 36. The layer of titanium 62 also covers the first source 22 and the first drain 24 in the NMOS device 12 and the second source 28 and the second drain 30 in the PMOS device 14.

Figure 10D:
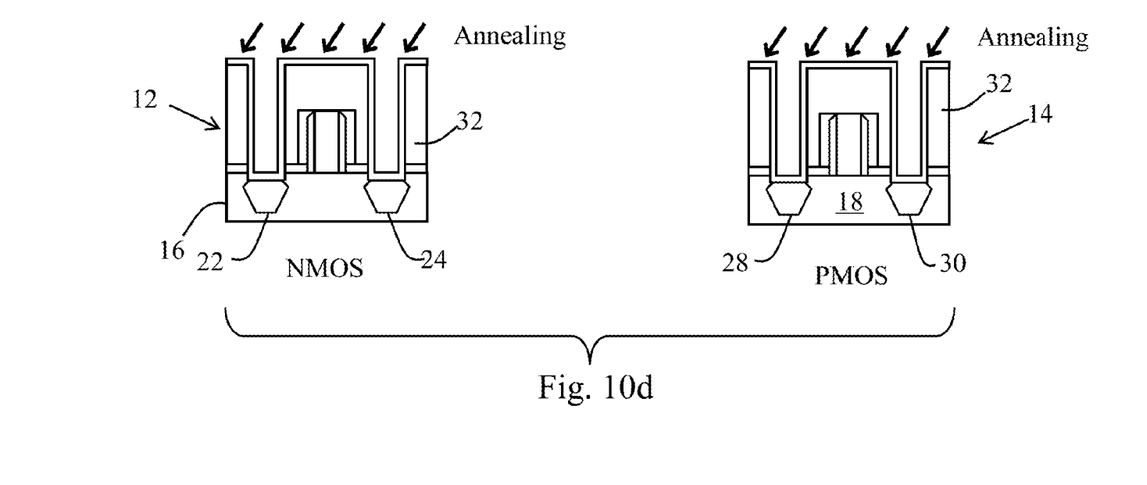

Referring now to FIG. 10d, an annealing process is performed (which is represented by the arrows). In an embodiment, the annealing process is performed at a temperature of about 300 degrees Celsius to about 500 degrees Celsius, at a vacuum ambient pressure of less than about $1 \times 10^{-7}$ Torr, and/or for a duration of about thirty minutes. In an embodiment, the annealing process may be performed under different conditions or using different parameters.

Figure 10E:
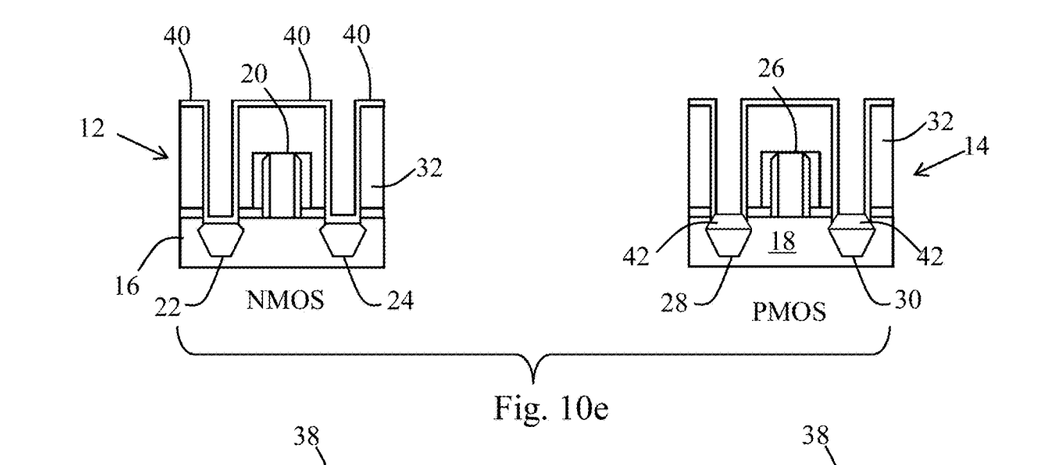

Referring now to FIG. 10e, the annealing process simultaneously forms the titanium-containing layer 40 and the titanium-containing region 42. As shown, the titanium-containing layer 40 resides on the top surface of the dielectric 32 and on the sidewalls of the trenches 36 in both the NMOS device 12 and the PMOS device 14. The titanium-containing layer 40 is also formed over the first source 22 and the first drain 24 of the NMOS device 12. As shown, the titanium-containing region 42 is formed in the second source 28 and the second drain 30 of the PMOS device 14. Notably, the titanium-containing layer 40 and the titanium-containing region 42 reduce the source/drain contact resistance in the NMOS device 12 and the PMOS device 14, respectively.

Figure 10F:
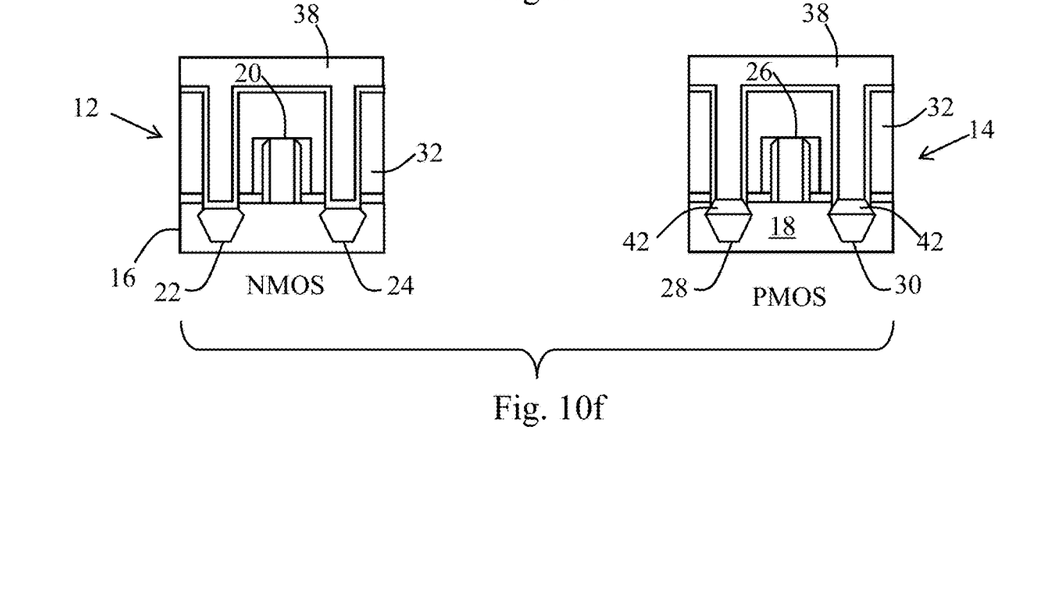

Referring now to FIG. 10f, the contact metal 38 is deposited over the titanium-containing layer 40 and the titanium-containing region 42 and within the trenches 36 of the NMOS device 12 and the PMOS device 14. Thereafter, the upper portions of the contact metal 38 are removed through, for example, a chemical-mechanical planarization (CMP) process to form the NMOS device 12 and the PMOS device 14 from the CMOS device 10 as shown in FIG. 1.

From the foregoing, it should be recognized that the embodiment CMOS device 10 of FIG. 1 has numerous advantages and benefits. For example, the CMOS device 10 offers low contact resistance and is easily integrated with CMOS technology. In addition, the CMOS device 10 uses a single metal (e.g., titanium) for both the n-type and p-type contacts to effectively lower Schottky barrier height, especially for low dopant activation material. The CMOS device 10 also benefits from automatic band-alignment for both the conduction and valence band to lower the contact resistivity.

An embodiment complimentary metal-oxide-semiconductor (CMOS) device includes an n-type metal-oxide-semiconductor (NMOS) device having a titanium-containing layer interposed between a first metal contact and an NMOS source and a second metal contact and an NMOS drain, and a p-type metal-oxide-semiconductor (PMOS) device having a PMOS source and a PMOS drain, the PMOS source having a first titanium-containing region facing a third metal contact, the PMOS drain including a second titanium-containing region facing a fourth metal contact.

An embodiment integrated circuit including a substrate supporting a first gate structure, a first source/drain region, a second gate structure, and a second source/drain region, the second source/drain region including a titanium-containing region, a first metal contact formed over the first source/drain region and a second metal contact formed over the second source/drain region, a dielectric disposed between the first gate structure and the first metal contact and between the second gate structure and the second metal contact, and a titanium-containing layer interposed between the first metal contact and the first source/drain region.

An embodiment method of forming an integrated circuit including forming a first source/drain region in an n-type substrate and a second source/drain region in a p-type substrate, forming a dielectric over the n-type substrate and the p-type substrate, etching trenches in the dielectric over the first source/drain region and the second source/drain region, depositing titanium in the trenches, and performing an annealing process to form titanium dioxide ($TiO_2$) over the first source/drain region and to generate a titanium-containing region in the second source/drain region.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A method of forming an integrated circuit, comprising:
    forming a first source/drain region in a p-type region and a second source/drain region in an n-type region;
    forming a dielectric over the n-type region and the p-type region;
    etching trenches in the dielectric over the first source/drain region and the second source/drain region;
    depositing titanium in the trenches; and
    while the titanium in the trenches over the first source/drain region and the second source/drain region is exposed, performing an annealing process to form titanium dioxide ($TiO_2$) over the first source/drain region and to generate a titanium-containing region in the second source/drain region, the titanium-containing region comprising a titanium-semiconductor compound.

2. The method of claim 1, further comprising performing the annealing process at a temperature of about 300 degrees Celsius to about 500 degrees Celsius.

3. The method of claim 1, further comprising performing the annealing process at a ambient pressure of less than about $1\times10^{-7}$ Torr.

4. The method of claim 1, further comprising performing the annealing process for about thirty minutes.

5. The method of claim 1, wherein the titanium-containing region comprises one of titanium silicon germanium (Ti(Si)Ge) and titanium digermanium ($TiGe_2$).

6. The method of claim 1, further comprising forming the titanium dioxide over the first source/drain region and generating the titanium-containing region in the second source/drain region simultaneously.

7. The method of claim 1, wherein the first source/drain region comprises one of silicon (Si), silicon phosphorus (SiP), silicon carbide phosphorus (SiCP), and a first silicon germanium (SiGe) having a first germanium concentration, and wherein the second source/drain region comprises germanium (Ge), germanium tin (GeSn), or a second silicon germanium (SiGe) having a second germanium concentration, the second germanium concentration higher than the first germanium concentration.

8. The method of claim 1, wherein the titanium-semiconductor compound comprises one of titanium silicon germanium and titanium digermanium.

9. The method of claim 1, wherein the $TiO_2$ is in physical contact with the first source/drain region.

10. A method of forming an integrated circuit, the method comprising:
    providing a substrate, the substrate having a first region and a second region;
    forming a first gate stack in the first region and a second gate stack in the second region;
    forming first source/drain regions of a first conductivity type along opposing sides of the first gate stack;
    forming second source/drain regions of a second conductivity type along opposing sides of the second gate stack;
    forming a dielectric over the substrate;
    forming first openings in the dielectric to expose the first source/drain regions and second openings in the dielectric to expose the second source/drain regions;
    depositing a titanium layer along bottoms of the first openings and the second openings; and
    annealing the substrate, the annealing simultaneously forming a first titanium-containing material along sidewalls and a bottom of the first openings, forming the first titanium-containing material along sidewalls of the second openings, and forming a second titanium-containing material along a bottom of the second openings, wherein the first titanium-containing material comprises titanium dioxide, and the second titanium-containing material comprises one of titanium silicon germanium and titanium digermanium.

11. The method of claim 10, wherein the annealing is performed at a temperature of about 300 degrees Celsius to about 500 degrees Celsius.

12. The method of claim 11, wherein the annealing is performed at a vacuum ambient pressure of less than about $1\times10^{-7}$ Torr.

13. The method of claim 12, wherein the annealing is performed for about thirty minutes.

14. The method of claim 10, further comprising forming a metal layer over the titanium layer in the first openings and the second openings.

15. The method of claim 14, wherein the forming the metal layer is performed after the annealing.

16. The method of claim 10, wherein no titanium silicide is formed between the first titanium-containing material and a respective underlying one of the first source/drain regions.

17. The method of claim 10, wherein the first titanium-containing material is in physical contact with a respective underlying one of the first source/drain regions.

18. A method of forming an integrated circuit, the method comprising:
    providing a substrate, the substrate having a first region and a second region;
    forming a first transistor in the first region and a second transistor in the second region, the first transistor having a first epitaxial material in first source/drain regions, the second transistor having a second epitaxial material in second source/drain regions;
    forming a dielectric layer over the first transistor and the second transistor;
    forming first openings and second openings in the dielectric layer, the first openings exposing the first epitaxial material and the second openings exposing the second epitaxial material;

depositing a titanium layer along surfaces of the first epitaxial material in the first openings and the second epitaxial material in the second openings; and simultaneously forming a first titanium-containing material in the first openings from the titanium layer and a second titanium-containing material in the second openings from the second epitaxial material and the titanium layer, the first titanium-containing material being a dielectric material, and the second titanium-containing material being a conductive material, the first titanium-containing material being does not contain the first epitaxial material.

19. The method of claim 18, wherein the forming the first titanium-containing material and the second titanium-containing material comprises annealing at a temperature of about 300 degrees Celsius to about 500 degrees Celsius.

20. The method of claim 19, wherein the annealing is performed at a vacuum ambient pressure of less than about $1 \times 10^{-7}$ Torr.

21. The method of claim 19, wherein the annealing is performed for about thirty minutes.

22. The method of claim 18, wherein the second titanium-containing material comprises one of titanium silicon germanium and titanium digermanium and wherein the first titanium-containing material comprises titanium dioxide.

* * * * *